United States Patent
Van De Peut et al.

(10) Patent No.: US 8,598,544 B2
(45) Date of Patent: Dec. 3, 2013

(54) METHOD OF GENERATING A TWO-LEVEL PATTERN FOR LITHOGRAPHIC PROCESSING AND PATTERN GENERATOR USING THE SAME

(75) Inventors: Teunis Van De Peut, Leusden (NL); Marco Jan-Jaco Wieland, Delft (NL)

(73) Assignee: Mapper Lithography IP B.V., Delft (NL)

( * ) Notice: Subject to any disclaimer, the term of this patent is extended or adjusted under 35 U.S.C. 154(b) by 172 days.

(21) Appl. No.: 13/293,370

(22) Filed: Nov. 10, 2011

(65) Prior Publication Data

US 2012/0286169 A1    Nov. 15, 2012

Related U.S. Application Data

(63) Continuation of application No. PCT/IB2010/052177, filed on May 17, 2010.

(60) Provisional application No. 61/179,760, filed on May 20, 2009.

(51) Int. Cl.
*H01J 37/06* (2006.01)
*H01J 37/07* (2006.01)
*G21K 5/10* (2006.01)

(52) U.S. Cl.
USPC .............. 250/492.22; 250/492.2; 250/492.3; 430/5; 430/296; 430/496

(58) Field of Classification Search
USPC ......... 250/398, 491.1, 492.1, 492.21, 492.22, 250/492.3; 430/5, 22, 30, 296, 396
See application file for complete search history.

(56) References Cited

U.S. PATENT DOCUMENTS

| | | | |
|---|---|---|---|
| 6,307,978 B1 | 10/2001 | Metaxas | |
| 6,768,125 B2 * | 7/2004 | Platzgummer et al. | .. 250/492.22 |
| 6,897,458 B2 | 5/2005 | Wieland et al. | |
| 6,958,804 B2 * | 10/2005 | Wieland et al. | ................. 355/67 |
| 7,075,093 B2 * | 7/2006 | Gorski et al. | ............... 250/492.2 |
| 7,084,414 B2 * | 8/2006 | Wieland et al. | .......... 250/492.23 |
| 7,129,502 B2 | 10/2006 | Kruit | |
| 7,294,440 B2 * | 11/2007 | Rankin et al. | .................... 430/30 |

(Continued)

FOREIGN PATENT DOCUMENTS

| | | |
|---|---|---|
| WO | WO 02091422 A2 | 11/2002 |
| WO | WO 03052516 A1 | 6/2003 |
| WO | WO 2007105939 A1 | 9/2007 |
| WO | WO 2009127658 A1 | 10/2009 |

OTHER PUBLICATIONS

Jarvis J F et al: "A Survey of Techniques for the Display of . . . " Computer Graphics and Image Processing, Academic Press. New York, US,vol. 5, Jan. 1, 1976, pp. 13-40.

(Continued)

*Primary Examiner* — Bernard E Souw
(74) *Attorney, Agent, or Firm* — Hoyng Monegier LLP; David P. Owen; Coraline J. Haitjema

(57) ABSTRACT

The invention relates to a method of generating a two-level pattern for lithographic processing by multiple beamlets. In the method, first a pattern in vector format is provided. The vector format pattern is then converted into a pattern in pixmap format. Finally, a two-level pattern is formed by application of error diffusion on the pixmap format pattern.

28 Claims, 5 Drawing Sheets

(56) References Cited

U.S. PATENT DOCUMENTS

| | | | |
|---|---|---|---|
| 7,573,561 B2* | 8/2009 | Fries | 355/67 |
| 2003/0155534 A1* | 8/2003 | Platzgummer et al. | 250/492.22 |
| 2005/0253093 A1* | 11/2005 | Gorski et al. | 250/492.22 |
| 2005/0269528 A1 | 12/2005 | Kruit | |
| 2006/0019412 A1* | 1/2006 | Rankin et al. | 438/4 |
| 2006/0269116 A1* | 11/2006 | Makarovic et al. | 382/141 |
| 2007/0139633 A1* | 6/2007 | Bleeker et al. | 355/67 |
| 2009/0261267 A1 | 10/2009 | Wieland et al. | |
| 2012/0286173 A1* | 11/2012 | Van De Peut et al. | 250/492.1 |
| 2012/0287410 A1* | 11/2012 | Wieland et al. | 355/18 |

OTHER PUBLICATIONS

"Multi-tone rasterization, dual pass scan, data path and cell based vector format" IP.COM Journal, IP.COM Inc., West Henrietta, NY, US, May 22, 2009.

* cited by examiner

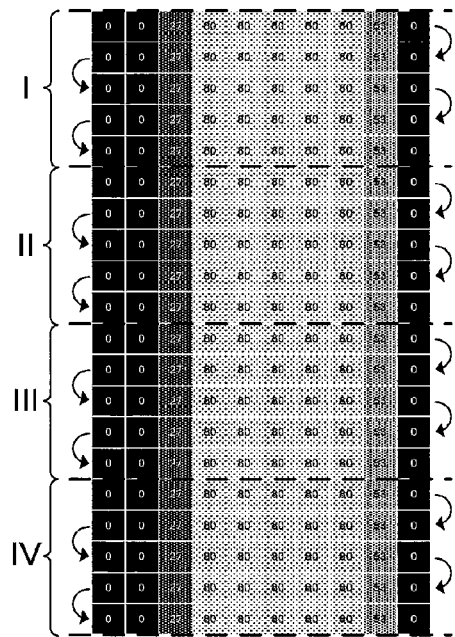
Fig. 7A　　　　　　Fig. 7B
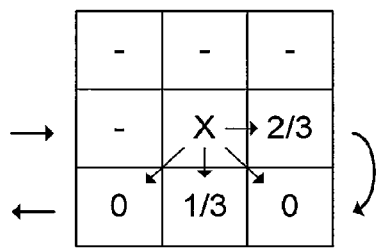　　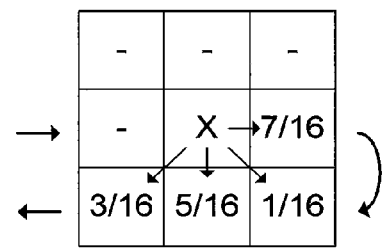
Fig. 8A　　　　　　Fig. 8B

METHOD OF GENERATING A TWO-LEVEL PATTERN FOR LITHOGRAPHIC PROCESSING AND PATTERN GENERATOR USING THE SAME

CROSS REFERENCE TO RELATED APPLICATIONS

This application is a continuation of PCT application number PCT/IB2010/052177 filed on 17 May 2010, which claims priority from U.S. provisional application No. 61/179,760 filed on 20 May 2009. Both applications are hereby incorporated by reference in their entireties.

BACKGROUND OF THE INVENTION

1. Field of the Invention

The present invention relates to a method of generating a two-level pattern for lithographic processing by multiple beamlets. The invention further relates to a computer readable medium for performing, when executed by a processor, such a method. The invention further relates to a pattern generator arranged for performing such a method. The invention further relates to a charged particle multi-beamlet system for exposing a target using a plurality of beamlets, in which the system comprises such a pattern generator. Finally, the invention relates to a lithographic system comprising such a pattern generator.

2. Description of the Related Art

Systems using a black and white writing strategy, i.e. an "on" and "off" writing strategy, are widely known in the art. They may use, for example, laser beams or charged particle beams, and may feature the use of direct writing in maskless systems. By modulating the beam (or beams in multi-beam systems), individual grid cells in a rasterized virtual grid may be exposed or not exposed to write the desired pattern on to the target. Such beams are characterized by a so-called beam effect in the target surface, which is often described by a point spread function. The point spread function generally has a Gaussian distribution, which describes the extent of the surface area affected by a beam. The beam size is generally defined as the size of the distribution in which 50% of the beam energy is present.

Generally, the spot area of the beam at the surface area is much larger than the typical size of the grid cells. A full exposure of a certain grid cell thus also causes an exposure with less intensity in the grid cells adjacent to the exposed cell. So, in case of a charged particle beam, the number of charged particles deposited within an individual grid cell, also referred to as dose, constitutes of the sum of the dose received directly from exposure of the grid cell itself and indirectly from exposure of adjacent cells. By selecting a suitable cut-off level for development of the resist layer being exposed, desired feature dimensions can be obtained.

A particular kind of charged particle beam based lithographic system is known from U.S. Pat. No. 6,897,458, assigned to the present owner of the invention, and involves a massive plurality of charged particle beamlets generated in a charged particle beam column for exposing a target. The charged particle beamlets are scanned over the target while being modulated. Additionally, the target may be capable of moving relative to the beams, for example in a direction transverse to the scanning direction of the beams. The modulation of the beamlets is performed on the basis of pattern data provided to the lithographic system. In the particular system described, the modulation is performed by blanking or blocking beamlets to effectively switch the beamlets on and off.

Exposing a target using this type of lithography system is achieved by the combination of relative movement of the target and modulation (e.g. timed "on" and "off" switching or blanking) of each charged particle beamlet. A known method to expose a substrate with beamlets is a raster scan method. In order to control the beamlets in such a scanning method, the pattern data is rasterized. The target is positioned on a motor driven stage that is moved in a continuous motion. As the stage is moved, the beam is scanned in a direction substantially perpendicular to the stage motion. By supplying the rasterized pattern data to the system, timed so that the beamlets are modulated in synchronism with the beamlet deflection and stage motion, the pattern represented by the pattern data can be transposed as an exposure pattern onto the surface of the target. The rasterized pattern data corresponds to an exposure pattern on a virtual raster cell grid on the surface of the target.

Existing charged particle beam technology is suitable for lithography systems for relatively course patterning of images, for example to achieve critical dimensions (CDs) of 90 nm and higher. However, a growing need exists for improved performance. It is desired to achieve considerably smaller critical dimensions, for example 22 nm, while maintaining sufficient wafer throughput, e.g. from 10 to 60 wafers per hour or higher.

In a conventionally rasterized pattern as discussed above feature placement is limited to the grid lines of the raster cell grid. However, due to for example correction rules needed to correct for several resolution-disturbing phenomena like the proximity effect, edges of a feature often do not necessarily fall on a grid line. For this reason, a tendency exists to choose the raster cell grid as small as possible.

However, in particular in charged particle beam systems using a plurality of beamlets, a grid size as large as possible is desired in view of data processing constraints. International application WO2007/105939, assigned to the present owner of the invention, addresses the issue of choosing a suitable grid size by introducing the use of "ragged" edges to enable placement of feature edges between grid lines.

A further difficulty of patterning with a plurality of beamlets is dose variation between different beamlets. In a charged particle system, the current per beamlet generally varies. In multibeam systems, different parts of a substrate to be patterned are exposed by different beamlets. As a result of beamlet dose variation, patterning errors may occur. A writing strategy as presented in WO2007/105939 is unable to resolve this issue.

BRIEF SUMMARY OF THE INVENTION

It is desirable to provide a method of generating a two-level pattern for lithographic processing by multiple beamlets with improved performance in respect of one or more of the issues discussed above. For this reason, the invention provides a method of generating a two-level pattern for lithographic processing by multiple beamlets, the method comprising: providing a pattern in vector format; converting the vector format pattern into a pattern in pixmap format; and forming a two-level pattern by application of error diffusion on the pixmap format pattern.

In an embodiment, the pixmap comprises an array of pixel cells. Within the array of pixel cells a multi-level (i.e. more than two levels) value is assigned to each pixel cell.

In an embodiment of the invention, providing multi-level values to pixel cells may be based on relative coverage of the vector-format pattern by the respective pixel cell. Alternatively or additionally, providing multi-level values to pixel cells may be based on dose level values of the vector format pattern.

In embodiments of the invention, the vector-format pattern may be a two-level pattern, i.e. it may be formed by two-level values.

The invention further relates to a computer readable medium for performing, when executed by a processor, embodiments of such a method.

The invention further relates to a pattern generator comprising: an input for receiving a pattern in vector format; a processing unit for performing a method of generating a two-level pattern for lithographic processing as described above; and an output for supplying the two-level pattern. The pattern generator may further comprise a memory for storing a pattern in pixmap format, the memory being communicatively coupled to the processing unit.

The invention further relates to a charged particle multi-beamlet system for exposing a target using a plurality of beamlets, the system comprising: a beamlet modulation system for modulating the plurality of beamlets so as to form an exposure pattern; a projection system for projecting the modulated beamlets on to the surface of the target; a deflector array for deflecting the plurality of beamlets in a first direction; a substrate support member for supporting the target to be exposed; a control unit arranged to coordinate relative movement between the substrate support member and the plurality of beamlets in a second direction and movement of the group of beamlets in the first direction such that the target can be exposed in accordance with an array of pixel cells; wherein the charged-particle multi-beamlet system further comprises a beamlet pattern generator as described above.

In an embodiment, the projection system comprises an array of projection lens systems. In a further embodiment, the plurality of beamlets is arranged in groups of beamlets, and each projection lens system corresponds with a group of beamlets.

Finally, the invention further relates to a lithographic system comprising: a preprocessing unit; a charged particle multi-beamlet system for exposing a target using a plurality of beamlets in accordance with a two-level pattern; wherein the preprocessing unit comprises a beamlet pattern generator as described above.

BRIEF DESCRIPTION OF THE DRAWINGS

Various aspects of the invention will be further explained with reference to embodiments shown in the drawings wherein:

FIGS. 7A, 7B schematically illustrate a result of applying one-dimensional evaluation of a multi-level pattern according to another embodiment of the present invention;

FIGS. 8A, 8B schematically illustrate different types of kernels that may be applied in two-dimensional error diffusion applied on a multi-level pattern according to embodiments of the invention;

DESCRIPTION OF ILLUSTRATIVE EMBODIMENTS

The following is a description of various embodiments of the invention, given by way of example only and with reference to the drawings.

Figure 1:
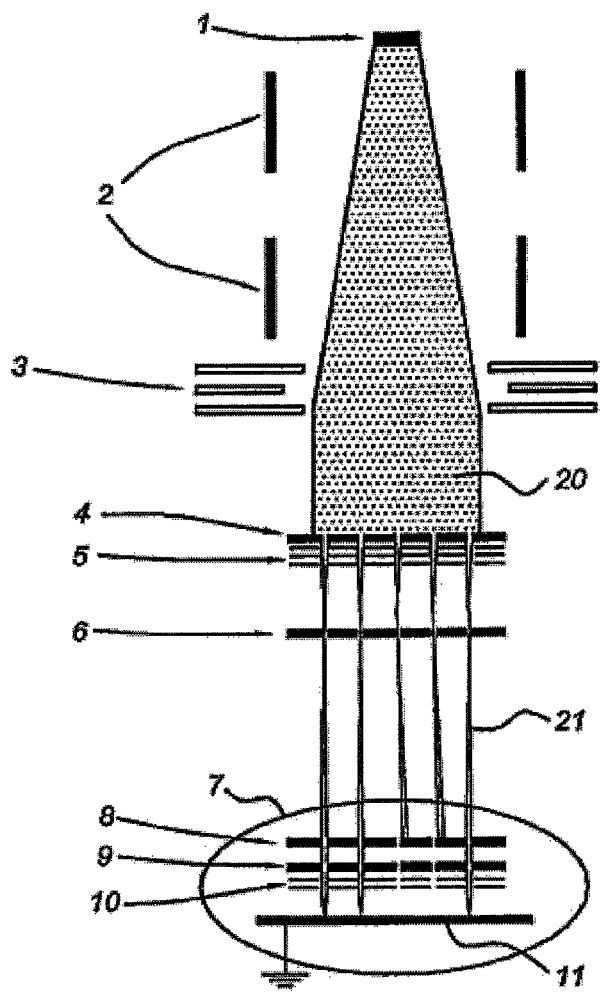
FIG. 1 is a simplified schematic overview of an example of a charged particle multi beamlet lithography system.

FIG. 1 shows a simplified schematic drawing of an embodiment of a charged particle multi-beamlet lithography system based upon an electron beam optical system without a common cross-over of all the electron beamlets. Such lithography systems are described for example in U.S. Pat. Nos. 6,897, 458 and 6,958,804 and 7,084,414 and 7,129,502 which are all hereby incorporated by reference in their entirety, assigned to the owner of the present invention.

In the embodiment shown in FIG. 1, the lithography system comprises an electron source 1 for producing a homogeneous, expanding electron beam 20. Beam energy is preferably maintained relatively low in the range of about 1 to 10 keV. To achieve this, the acceleration voltage is preferably low, the electron source preferably kept at between about −1 to −10 kV with respect to the target at ground potential, although other settings may also be used.

The electron beam 20 from the electron source 1 passes a double octopole 2 and subsequently a collimator lens 3 for collimating the electron beam 20. Subsequently, the electron beam 20 impinges on an aperture array 4, which blocks part of the beam and allows a plurality of beamlets 21 to pass through the aperture array 4. The aperture array preferably comprises a plate having through holes. Thus, a plurality of parallel electron beamlets 21 is produced. The system generates a large number of beamlets 21, preferably about 10,000 to 1,000,000 beamlets, although it is of course possible to use more or less beamlets. Note that other known methods may also be used to generate collimated beamlets.

The plurality of electron beamlets 21 pass through a condenser lens array 5 which focuses each of the electron beamlets 21 in the plane of a beamlet blanker array 6. This beamlet blanker array 6 preferably comprises a plurality of blankers which are each capable of deflecting one or more of the electron beamlets 21.

Subsequently, the electron beamlets 21 enter an end module 7. The end module 7 is preferably constructed as an insertable, replaceable unit which comprises various components. In this embodiment, the end module 7 comprises a beam stop array 8, a beam deflector array 9, and a projection lens arrangement 10, although not all of these need be included in the end module 7 and they may be arranged differently. The end module 7 will, amongst other functions, provide a demagnification of about 25 to 500 times, preferably in the range 50 to 200 times. A slightly lesser demagnification is required in systems generating patterned subbeams, which will be discussed with reference to FIG. 3.

The end module 7 preferably deflects the beamlets as described below. After leaving the end module 7, the beamlets 21 impinge on a surface of a target 11 positioned at a target plane. For lithography applications, the target usually comprises a wafer provided with a charged-particle sensitive layer or resist layer.

In the end module 7, the electron beamlets 21 first pass beam stop array 8. This beam stop array 8 largely determines the opening angle of the beamlets. In this embodiment, the beam stop array 8 comprises an array of apertures for allowing beamlets to pass through. The beam stop array 8, in its basic form, comprises a substrate provided with through holes, typically round holes although other shapes may also be used. In one embodiment, the substrate of the beam stop array 8 is formed from a silicon wafer with a regularly spaced array of through holes, and may be coated with a surface layer of a metal to prevent surface charging. In one embodiment, the metal is of a type which does not form a native-oxide skin layer, such as CrMo.

In one embodiment, the passages of the beam stop array 8 are aligned with the elements of the beamlet blanker array 6. The beamlet blanker array 6 and beam stop array 8 operate together to block or let pass the beamlets 21. If beamlet blanker array 6 deflects a beamlet, it will not pass through the corresponding aperture in beam stop array 8, but instead will be blocked by the substrate of beam stop array 8. But if beamlet blanker array 6 does not deflect a beamlet, then it will pass through the corresponding aperture in beam stop array 8 and will then be projected as a spot on the surface of target 11. In this way the individual beamlets 21 may be effectively switched on and off.

Next, the beamlets 21 pass through a beam deflector array 9 which provides for deflection of each beamlet in the X and/or Y direction, substantially perpendicular to the direction of the undeflected beamlets 21. Next, the beamlets 21 pass through projection lens arrangement 10 and are projected onto a target 11, typically a wafer, in a target plane.

The diameter of the apertures in beam stop array 8 may limit the cross section of a beamlet, such that only a central part of the beamlet is allowed to pass through for projection onto target 11. This central part of a beamlet has a relatively uniform charge density. Such cut-off of a circumferential section of a beamlet by the beam stop array 8 also largely determines the opening angle of a beamlet in the end module 7 of the system, as well as the amount of current at the target 11. In one embodiment, the apertures in beam stop array 8 are round, resulting in beamlets with a generally uniform opening angle.

Figure 2:
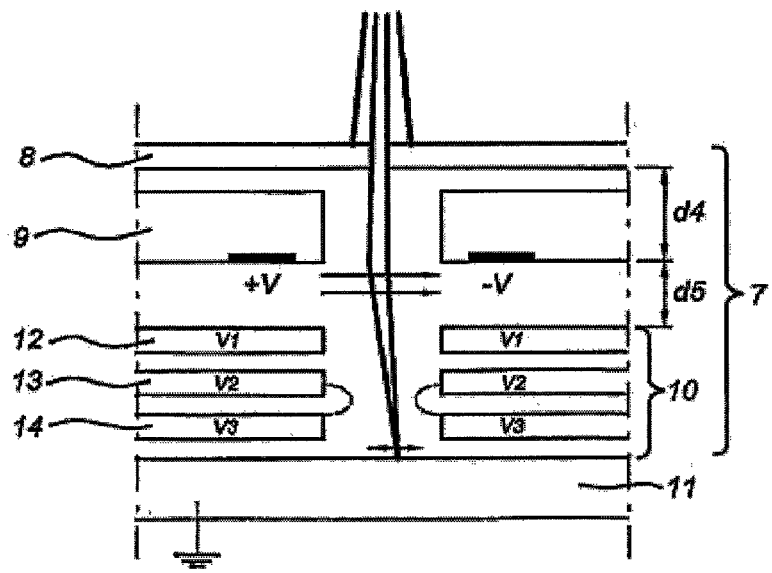
FIG. 2 is a simplified schematic overview, in side view, of an end module of the lithography system of FIG. 1.

FIG. 2 shows an embodiment of the end module 7 in more detail, showing the beam stop array 8, the deflection array 9, and the projection lens arrangement 10, projecting an electron beamlet onto a target 11. The beamlets 21 are projected onto target 11, preferably resulting in a geometric spot size of about 10 to 30 nanometers in diameter, and more preferably about 20 nanometers. The projection lens arrangement 10 in such a design preferably provides a demagnification of about 100 to 500 times. In this embodiment, as shown in FIG. 2, a central part of a beamlet 21 first passes through beam stop array 8 (assuming it has not been deflected by beamlet blanker array 6). Then, the beamlet 21 passes through a deflector or set of deflectors arranged in a sequence forming a deflection system, of beam deflector array 9. The beamlet 21 subsequently passes through an electro-optical system of projection lens arrangement 10 and finally impinges on a target 11 in the target plane.

The projection lens arrangement 10, in the embodiment shown in FIG. 2, has three plates 12, 13 and 14 arranged in sequence, used to form an array of electrostatic lenses. The plates 12, 13, and 14 preferably comprise plates or substrates with apertures formed in them. The apertures are preferably formed as round holes though the substrate, although other shapes can also be used. In one embodiment, the substrates are formed of silicon or other semiconductor processed using process steps well-known in the semiconductor chip industry. The apertures can be conveniently formed in the substrates using lithography and etching techniques known in the semiconductor manufacturing industry, for example. The lithography and etching techniques used are preferably controlled sufficiently precisely to ensure uniformity in the position, size, and shape of the apertures. This uniformity permits the elimination of the requirement to individually control the focus and path of each beamlet.

Uniformity in the positioning of the apertures, i.e. a uniform distance (pitch) between the apertures and uniform arrangement of the apertures over the surface of the substrate, permits the construction of a system with densely packed beamlets which generate a uniform grid pattern on the target. Furthermore, in systems where multiple plates are used, the corresponding apertures in each plate are aligned. Misalignment in the apertures between plates may cause a difference in focal length along different axes.

Uniformity in the size of the apertures enables uniformity in the electrostatic projection lenses formed at the locations of the apertures. Deviation in the size of the lenses will result in deviation in the focusing, so that some beamlets will be focused on the target plane and others will not.

Uniformity in the shape of the apertures is also important. Where round holes are used, uniformity in the roundness of the holes results in the focal length of the resulting lens being the same in both axes.

The substrates are preferably coated in an electrically conductive coating to form electrodes. The conductive coating preferably forms a single electrode on each substrate covering both surfaces of the plate around the apertures and inside the holes. A metal with a conductive native oxide is preferably used for the electrode, such as molybdenum, deposited onto the plate using techniques well known in the semiconductor manufacturing industry, for example.

FIG. 2 shows the plates 12, 13, and 14 having electric voltages V1, V2 and V3 respectively applied to their electrodes. The voltage differences between the electrodes of plates 12 and 13, and between plates 13 and 14, create electrostatic lenses at the location of each aperture in the plates. This generates a "vertical" set of electrostatic lenses at each position in the array of apertures, mutually aligned, creating an array of projection lens systems. Each projection lens system comprises the set of electrostatic lenses formed at corresponding points of the arrays of apertures of each plate. Each set of electrostatic lenses forming a projection lens system can be considered as a single effective projection lens, which focuses and demagnifies one or more beamlets, and has an effective focal length and an effective demagnification.

Each electrode is controlled by a single control voltage for the complete array. Thus, in the embodiment shown with three electrodes there will be only three voltages for all the thousands of lenses. In systems where only a single plate is used, a single voltage may be used in conjunction with a ground plane, such that electrostatic lenses are formed at the location of each aperture in the plate.

The characteristics of the electrostatic lenses are controlled by the three control voltages, so that the amount of focusing and demagnification of all of the beamlets can be controlled by controlling these three voltages. In this way, a single common control signal can be used to control a whole array of electrostatic lenses for demagnifying and focusing a very large number of electron beamlets. A common control signal may be provided for each plate or as a voltage difference between two or more plates. The number of plates used in different projection lens arrangements may vary, and the number of common control signals may also vary.

FIG. 2 also illustrates deflection of a beamlet 21 by deflection array 9 in the Y-direction, illustrated in FIG. 2 as a deflection of the beamlet from left to right. In the embodiment of FIG. 2, an aperture in deflection array 9 is shown for one or more beamlets to pass through, and electrodes are provided on opposite sides of the aperture, the electrodes provided with a voltage +V and −V. Providing a potential difference over the electrodes causes a deflection of the beamlet or beamlets passing though the aperture. Dynamically changing the voltages (or the sign of the voltages) will allow the beamlet(s) to be swept in a scanning fashion, here in the Y-direction.

In the same way as described for deflection in the Y-direction, deflection in the X-direction may also be performed back and/or forth (in FIG. 2 the X-direction is in a direction into and out of the paper). In the embodiment described, one deflection direction may be used for scanning the beamlets over the surface of a substrate while the substrate is translated in another direction using a scanning module or scanning stage. The direction of translation is preferably transverse to the Y-direction and coinciding with the X-direction.

More details with respect to the end module 7 as schematically shown in FIG. 2 are described in U.S. application Ser. No. 12/393,050, which is hereby incorporated by reference in its entirety, assigned to the owner of the present invention.

The total current of the beamlets required to achieve a particular throughput (i.e. a particular number of wafers exposed per hour) depends on the required dose, the area of the wafer, and the overhead time (e.g. the time to move a new wafer into position for exposure). The required dose in these shot noise limited systems depends on the required feature size and uniformity, and beam energy, among other factors.

To obtain a certain feature size (critical dimension or CD) in resist using electron beam lithography, a certain resolution is required. This resolution is determined by three contributions: beam size, the scattering of electrons in the resist, and secondary electrons mean free path combined with acid diffusion. These three contributions add up in a quadratic relation to determine the total spot size. Of these three contributions the beam size and the scattering depend on the acceleration voltage. To resolve a feature in the resist the total spot size should be of the same order of magnitude as the desired feature size (CD). Not only the CD but also the CD uniformity is important for practical applications, and this latter requirement will determine the actual required spot size.

For electron beam systems, the maximum single beam current is determined by the spot size. For small spot size the current is also very small. To obtain a good CD uniformity, the required spot size will limit the single beam current to much less than the current required to obtain a high throughput. Thus a large number of beamlets is required (typically more than 10,000 for a throughput of 10 wafers per hour). For an electron beam system, the total current through one lens is limited by Coulomb interactions between electrons, so that a limited number of beamlets can be sent through one lens and/or one cross-over point. This consequently means that the number of lenses in a high throughput system also needs to be large.

The requirement for a considerable increase in the number of beamlets in the system creates a practical problem due to the of the limited physical dimensions of the projection optics of a multi-beamlet lithography system. The projection optics in such systems are typically limited in size to accommodate, for example the fields of the target to be exposed by the system. There is a limit to the number of lenses that may be physically realized within a relatively small area that the projection optics, i.e. the end projection module may occupy in practical designs. At the reduced critical dimensions to be achieved, the number of lenses that can be constructed within these dimensions using known techniques is considerably smaller than the number of beamlets required to achieve the desired wafer throughput.

A solution that still avoids a common cross-over of the beamlets can be achieved by adding array manipulators to the system, for example a group deflector array or a condenser lens array for directing a plurality of beamlets towards a single projection lens system for projecting onto the target.

The solution allows the use of technology corresponding to that applied in the concept of FIG. 1 and minimizes aberration in the system while allowing a disproportionate increase in the number of beamlets in the system. The solution of using multiple beamlets per projection lens was found after recognition of the fact that with the deflecting action of deflector array 9 in the end module 7, a virtual point of origin of the deflected beamlet is created, so that a virtual beamlet was imagined. This notion led to the idea that such virtual beamlet could as well be replaced by a real beamlet, or a plurality of real beamlets. In practice the application of multiple real beamlets through a single projection lens system appeared to be possible without disturbing the amount of aberration, especially where the total beamlets of the system were distributed over a multiplicity of projection lens systems.

Because part or all of the plurality of beamlets directed through to a each projection lens system may be blanked at any point in time during operation, a system as introduced above will be referred to as a patterned subbeam system. A patterned subbeam system may be regarded as a multiplicity of miniaturized imaging systems arranged side by side.

Figure 3:
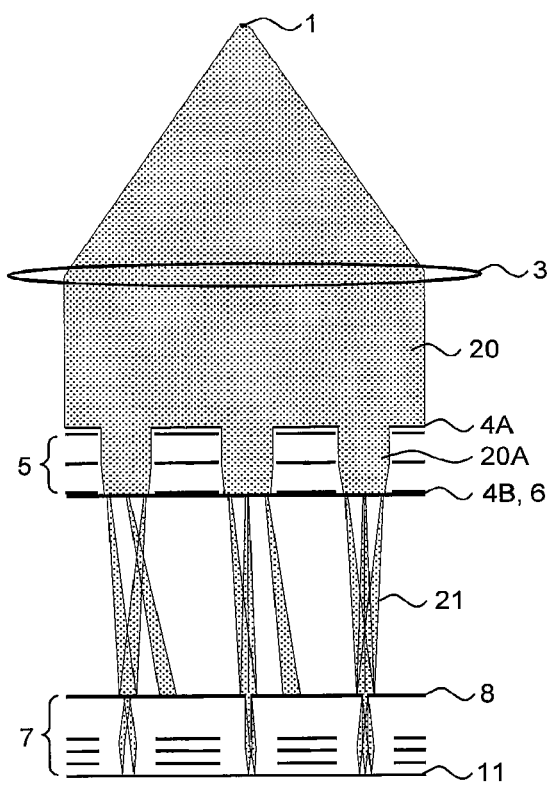
FIG. 3 illustrates an example of a charged particle multi beamlet lithography system with groups of patterned beamlets.

FIG. 3 illustrates an embodiment of a patterned subbeam system. In this embodiment, the patterned subbeam system comprises an aperture array 4A for creating sub-beams 20A and an aperture array 4B for creating beamlets 21. A condenser lens array 5 (or a set of condenser lens arrays) is included behind the sub-beam creating aperture array 4A, for focusing the sub-beams 20A towards a corresponding opening in the beam stop array 8 of the end module 7. The beamlet creating aperture array 4B is preferably included in combination with a beamlet blanker array 6, i.e. arranged close together with array 4B before beamlet blanker array 6 or the other way around.

Aperture arrays 4A and 4B may be integrated in a single structure for producing groups of beamlets 21. The condenser lens array 5 is then preferably located downstream the single structure. Such design advantageously provides a simple and economic means for realizing a multiple beamlet per projection lens system. Further details and advantages of embodiments of a patterned subbeam system are described in international application PCT/EP2009/054467, which is hereby incorporated by reference in its entirety, assigned to the owner of the present invention.

Exposing a target using a lithography system as shown in FIG. 1 or FIG. 3 may be achieved by a combination of relative movement of the target with respect to other elements within the system, e.g. aperture array 4, beamlet blanker array 6, and beamlet stop array 8, and modulation (e.g. timed "on" and "off" switching or blanking) of each charged particle beamlet.

A known manner of exposing a target with beamlets is exposure by means of a so-called raster scan method. In such method, in order to accurately expose the target with an exposure pattern, the pattern data is converted into a pixmap format. Throughout the description, the term "pixmap" will be used to refer to a spatially mapped array of pixel cells. A pixel cell, throughout the description sometimes referred to as grid cell, relates to the smallest unit of information in the pattern to be exposed. Pixel cells are generally arranged in a two-dimensional grid, and are often represented using dots, squares, or rectangles. Within this specification, pixel cells will be represented by squares.

Then, the target is positioned on a motor driven stage that is moved in a continuous motion in a first direction. As the stage moves in the first direction, the beamlets are scanned in a second direction, the second direction being substantially perpendicular to the first direction of stage motion.

In the raster scan method, the exposure pattern is converted into a format comprising an array of cells, also referred to as "grid". By supplying the converted pattern in the form of pattern data to the lithography system in such a way that beamlet modulation occurs in synchronism with the beamlet deflection and stage motion, the exposure pattern can be transposed onto the target.

Figure 4A:
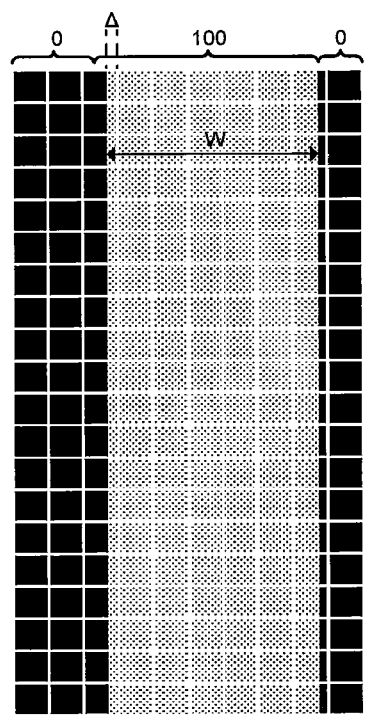
FIGS. 4A, 4B schematically illustrate the concept of forming a multi-level pattern.
Figure 4B:
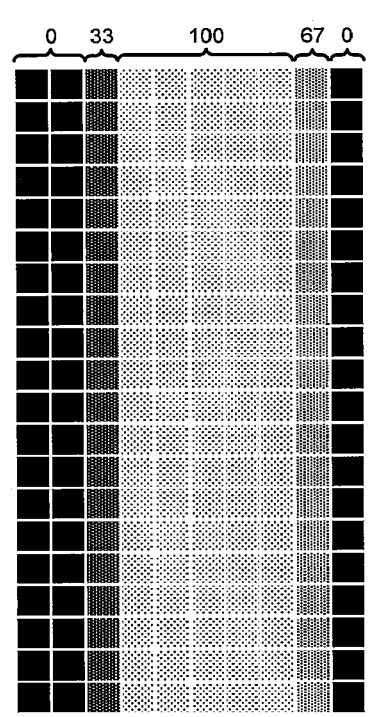

FIGS. 4A, 4B schematically illustrate the concept of forming a multi-level pattern. In FIG. 4A, a line pattern is shown featuring a line with line width W. A grid with addressable pixel cells is overlaid on the line pattern. The pattern is a two-level pattern. The term "level" relates to the dose (e.g. number of charged particles like electrons) provided by the beamlets exposing a specified area as compared to the maximum dose that could be provided in that area. The two-level pattern shown in FIG. 4A corresponds to a so-called black-and-white pattern. The "black" dose level corresponds to no dose. The "white" dose level corresponds to a full dose. In this example, the black level is denoted by 0, and the white level is denoted by 100. Note that in digital applications, 100% generally corresponds to the maximum value that can be set with the number of bits available. For example, an 8-bit application allows a maximum value of 255.

It is not essential that the two-level pattern has levels corresponding to no dose and full dose. The two dose levels may be set to any value between 0% and 100% of the maximum dose that can be reliably provided by beamlets in a charged particle multi-beamlet system. For example, it may be possible to use a two-level pattern in which the low dose level corresponds to a dose level that is 20% of the maximum dose level, while the high dose level corresponds to a dose level that is 90% of the maximum dose level. However, it is advantageous that the two different dose levels are not very close to each other.

It can be readily seen in FIG. 4A that conversion of the format of the pattern towards a pixmap format by applying the grid does not necessarily result in a full correspondence between a line edge and a grid cell boundary. Patterning the line pattern by providing either a low dose or a high dose per pixel cell (black-and-white patterning) would result in a line shift Δ. In view of the very demanding requirements in lithography with respect to feature placement, such shift is highly undesirable.

Furthermore, the line width W does not necessarily correspond to a multiple of a pixel cell width. As a result, if a two-level exposure would be performed in accordance with the applied grid, the exposed line width could be different from line width W. Feature size is a driving force in lithographic processing. Limitations of feature sizes to multiples of pixel cell dimensions would be highly undesirable as well.

The inventors realized that these problems could be avoided by first forming a multi-level pattern as schematically shown in FIG. 4B. In this context the term "multi-level" means having more than two possible dose levels, e.g. gray scale rather than black and white. Formation of the multi-level pattern includes assigning a discrete multi-level value to each pixel cell in correspondence with its relative coverage of the pattern.

In the examples shown throughout the description the array of pixel cells, or grid, used to form a multi-level pattern is identical to the grid used to form the two-level pattern. It must be understood that this is merely to explain the invention and is not intended to be limiting. For example, grid cells of the multi-level pattern may comprise 4 (2×2) pixel cells of the two-level pattern, or vice versa.

In the example shown in FIG. 4A, the left edge of the line pattern falls part way across a row of pixel cells so that the line pattern occupies 33% (⅓) of each pixel cell of that row, and the right edge of the line pattern falls part way across a row of pixel cells so that the line pattern occupies 67% (⅔) of each pixel cell of that row. A corresponding multi-level pattern is shown in FIG. 4B. The pixel cells falling totally within the line pattern are exposed with dose value 100. The value, hereinafter referred to as gray value, assigned to each pixel cell covering the left line edge therefore equals 0.33×100=33. Similarly, the pixel cells at the right edge of the line pattern are assigned 0.67×100=67 as gray value.

Selecting the size of pixel cells relates, among others, to the amount of data storage capacity available, the desired speed of processing, the desired dose control, and the desired accuracy of feature placement. A suitable number of levels in the multi-level pattern may be determined by using the following formula:

$$\text{round}\left(\frac{\text{spot\_area}}{\text{pixelcell\_area}}\right) \quad (1)$$

wherein pixelcell_area corresponds to the area of a pixel cell and spot area corresponds to the area occupied by a beamlet spot used to project a pattern onto a target. Round refers to rounding the obtained value to the nearest integer.

This number of levels ensures that a maximum number of gray levels is used in assignment of the multi-level pattern with limited calculation capacity. More levels not necessarily leads to better performance, while they will demand more calculation capacity. In practice, the number of levels preferably corresponds to the first bit size that exceeds the number obtained by using formula (1). For example, if the lower integer determined by using formula (1) equals 100, the number of available gray levels will generally be set to 128 (7 bits).

In order to obtain a rasterized pattern that can be written by means of a multi-beamlet lithography system configured for exposure by black-and-white patterning, e.g. a lithography system as schematically shown in FIG. 1 or FIG. 3, embodiments of the invention comprise the forming of a two-level pattern by application of error diffusion on the multi-level pattern.

Digital halftoning or dithering is a technique used to render a grayscale image on a two-level display. Error diffusion is a type of dithering that involves reducing the number of quantization levels by distributing quantization residual in a grid cell to one or more neighboring grid cells which have not yet been processed.

In embodiments of the present invention, error diffusion is used to form a two-level pattern. Starting with the multi-level pattern, the gray value of each pixel cell is evaluated. If the gray value of the pixel cell under evaluation is higher than a certain threshold value, typically 50% of the full dose value, then the pixel cell is defined as a "white" pixel cell, i.e. a pixel cell to be exposed with the high dose value (100 in examples throughout this specification). If the gray value of the pixel cell under evaluation is lower than the threshold value, the pixel cell is defined as a "black" grid cell, i.e. a pixel cell to be exposed with the low dose value (0 in examples throughout this specification). The difference between the value corresponding to the assigned level (high/low) and the actual value within the pixel cell under evaluation, hereafter referred to as the quantization residual of the evaluated pixel cell, is then shifted to one or more neighboring pixel cells in accordance with a predetermined kernel.

Figure 5A:
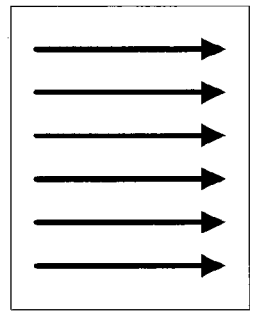
FIGS. 5A, 5B schematically illustrate two different trajectories for evaluation of a multi-level pattern by means of error diffusion.
Figure 5B:
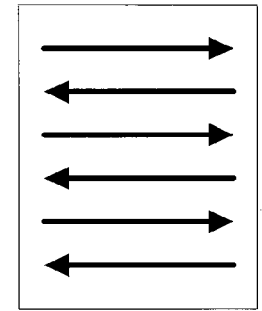

The pixel cells are evaluated along a certain trajectory. FIGS. 5A, 5B schematically illustrate two different trajectories for evaluation of pixel cells in a multi-level pattern by means of error diffusion.

FIG. 5A schematically shows a trajectory which will be denoted as a "raster"-trajectory. In a raster-trajectory, grid cells in a single row are evaluated sequentially in a single direction. As a result, parallel evaluation can be implemented rather easily. Evaluation of pixel cells while following a raster-trajectory may thus save time.

FIG. 5B schematically shows a trajectory which will be denoted as a "serpentine"-trajectory. In a serpentine-trajectory the sequence of pixel cells to be evaluated alternates in direction for each row.

Figure 6A:
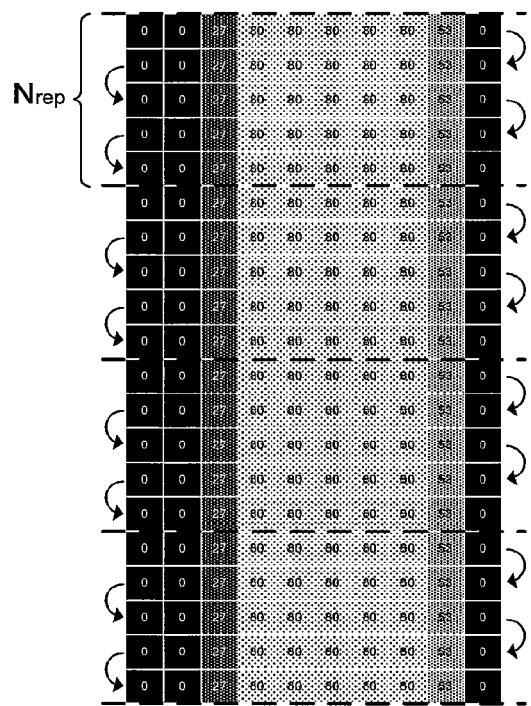
FIGS. 6A, 6B schematically illustrates a result of applying one-dimensional evaluation of a multi-level pattern according to an embodiment of the present invention.
Figure 6B:
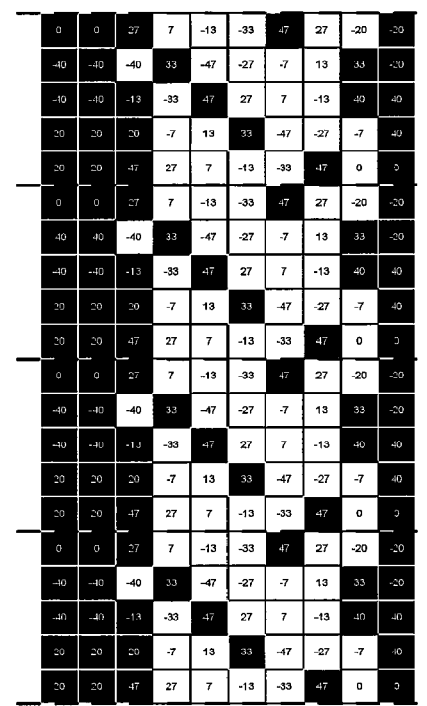

FIGS. 6A, 6B schematically illustrate a result of applying a one-dimensional evaluation of a multi-level pattern according to an embodiment of the invention. In one-dimensional (1D) evaluation by error diffusion, the quantization residual solely shifts to the next cell to be evaluated.

FIG. 6A schematically illustrates a rasterized multi-level line pattern that is similar to the pattern shown in FIG. 4B. In this case, the high dose level of the originating two-level pattern (not shown) equals 80 instead of 100. The pixel cells covering the left edge of the line pattern are filled for about one third with the pattern. The right edge of the line pattern is part of a column of pixel cells that is occupied for about two thirds with the line pattern. Thus, following the method discussed earlier with reference to FIGS. 4A, 4B, the gray value for the column of pixel cells covering the left edge of the line structure equals ⅓×80=27. Similarly, the gray value for grid cells covering the right edge of the line structure equals ⅔×80=53.

FIG. 6B schematically illustrates a two-level pattern resulting from pixel cell evaluation of the multi-level pattern of FIG. 6A along a plurality of adjacent serpentine trajectories, each serpentine trajectory evaluating 5 rows of pixel cells forming an evaluation block. The division of the pattern into evaluation blocks limits the occurrence of periodicity caused by the process of 1D error diffusion. The number of evaluation lines $N_{rep}$ for a suitable evaluation block size may be determined with the following equation:

$$N_{rep} = \text{round}\left(\frac{RPA \times \text{spot\_area}}{\text{pixelcell\_area}}\right) \quad (2)$$

where RPA is the relative placement accuracy required for the pattern to be evaluated. The relative placement accuracy is a design parameter related to the desired placement accuracy of a feature in the pattern data in comparison to the size of the pixel cell. For example, if the placement requirement is 1 nm and the pixel cell size is 4 nm, RPA equals ¼=0.25.

The evaluation of the pixel cells in FIG. 6A to obtain the two-level pattern of FIG. 6B uses one-dimensional error diffusion. As discussed earlier, in one-dimensional error diffusion, diffusion of the quantization residual takes place along the evaluation trajectory through the pattern. That is, the quantization residual of a pixel cell under evaluation is added to the next pixel cell to be evaluated before evaluation of that next pixel cell takes place.

In the embodiment schematically shown in FIGS. 6A, 6B, a threshold value of 50 has been used in the error diffusion process, 50 representing half the maximum dose level.

Now consider the top row in FIG. 6A starting from the left. The first two cells have a gray value of 0. In the algorithm described above these cells will be recognized as black cells. Additionally, because there is no difference between the actual value and the assigned value, no residual is added to the next cell under evaluation. This is different for the third cell. The third cell has a gray value of 27. This value is below the threshold value of 50. Thus, as schematically illustrated in FIG. 6B, this grid cell is considered to be a black cell, i.e. a cell with value 0. Therefore, the residual of the third grid cell is 27−0=27.

In the next cell under evaluation, being the fourth cell in the top row taken from the left hand side, the residual is added to the gray value present therein. The result of this addition is that the value in the fourth grid cell for evaluation purposes now equals 80 (=original gray value)+27 (=residual from third cell)=107. This value exceeds the threshold value of 50. Thus, the fourth cell is registered as a white cell. The residual of this cell, 107−100=7, is again transferred to the next cell under evaluation and added to the gray value therein. This evaluation process continues along the serpentine trajectory until the end of the fifth row.

The evaluation process described above is similarly performed for the other evaluation blocks with $N_{rep}$ lines, i.e. the sixth row until the tenth row, the eleventh row until the fifteenth row, etc.

FIGS. 7A, 7B schematically illustrate a result of applying one-dimensional evaluation of a multi-level pattern according to another embodiment of the present invention. In this embodiment, the 1D-error diffusion that is applied uses different settings for separate beamlets. Using such a technique allows for beamlet-to-beamlet adjustments in dose control within a multi-beamlet lithographic apparatus.

In FIGS. 7A, 7B, it is assumed for explanatory purposes that pixel cells in blocks I-IV are patterned by four separate beamlets, each beamlet being responsible for the patterning of one block. In reality, among others due to the beamlet spot size typically being much larger than the cell size, exposure of individual pixel cells is performed by a number of beamlets. The performance of the beamlet responsible for block I and the beamlet responsible for block IV operate within specifications. However, the intensity of the beamlet for patterning block II is too low, while the intensity of the beamlet for patterning block III is higher than desired. Due to these offsets in beamlet intensity, processing the pattern as shown in FIG. 6B would lead to patterning inaccuracy. Determining whether a beamlet performs within specifications or not may be determined by using beamlet current measurements. Methods for beamlet measurement are described, for example, in U.S. patent application 61/122,591, which is incorporated by reference herein in its entirety.

In embodiments of the invention, the settings for error diffusion may be defined per individual beamlet. In section II, the settings may be compensated for the low beamlet intensity. In section III, the settings may be adapted to accommodate the beamlet intensity being higher than desired. Compensation may be performed by amendment of an error diffusion parameter. Examples of error diffusion parameters that can be amended include an error diffusion threshold value used to form the two-level pattern, or the absolute settings of the high dose value and/or the low dose value used in the two-level pattern.

In FIGS. 7A, 7B, compensation has been performed by adapting the error diffusion threshold value. Instead of using a threshold of 50, which is used in blocks I and IV, a threshold of 40 is used for the pixel cells of block II, while a threshold of 60 is used for the pixel cells in block III. As can be readily seen in FIG. 7B, the two-level pattern in blocks II and III differ from the pattern in blocks I and IV (which is similar to the pattern for such blocks shown in FIG. 6B).

Amendment of the high dose value, i.e. the white level value, could lead to similar results as shown in FIG. 7B. In this case, the white level value used in the error diffusion calculations could be lowered to 80 in case of patterning of block II, while it would be raised to 120 in case of determining the rasterized two-level pattern to be offered to block III.

In the examples described above with reference to FIGS. 6A, 6B, 7A, and 7B, one dimensional (1D) error diffusion is applied. It has been found that the use of 1D-error diffusion already provides significant improvement with respect to pattern placement and dose control, in particular in a multi-beamlet lithographic apparatus.

However, the performance of 1D-error diffusion is highly dependent on the evaluation trajectory, and the size of the evaluation blocks. The use of 2D-error diffusion is advantageous in that respect because the error diffusion is far less dependent on the evaluation trajectory. Additionally, for many applications, 2D-error diffusion provides an even better performance with respect to pattern placement and dose control. 2D-error diffusion may be performed with different types of kernels as will be explained with reference to FIGS. 8A, 8B.

FIG. 8A schematically illustrates the concept of a type of 2D-error diffusion that may be used in embodiments of the present invention. In the 3×3-matrix under evaluation shown in FIG. 8A, the top row has already been evaluated. The same holds for the left pixel cell in the center row. The center pixel cell, in FIG. 8A denoted as "X", is the cell that is under evaluation. In the type of 2D-error diffusion of FIG. 8A, ⅔ of the quantization residual is shifted to the next cell to be evaluated, i.e. the right pixel cell in the center row. Additionally, ⅓ of the quantization residual is shifted to the neighboring cell in the next row, i.e. the center cell in the bottom row. Neighboring pixel cells sharing a corner with the cell under evaluation, i.e. the left and right cell in the bottom row, do not receive any portion of the quantization residual.

FIG. 8B schematically illustrates the concept of another type of 2D-error diffusion that may be used in embodiments of the present invention. This type of 2D-error diffusion uses the so-called Floyd-Steinberg kernel. The Floyd-Steinberg kernel transfers 7/16 of the quantization residual to the next pixel cell under evaluation. Additionally, 5/16 of the quantization residual is forwarded to the neighboring cell in the next row. Contrary to the type of 2D-error diffusion illustrated in FIG. 8A, the neighboring cell sharing a corner with the cell under evaluation, also receives a portion of the quantization residual. A portion of 3/16 of the quantization residual is transferred to the neighboring cell diagonally located in a forward direction from the cell under evaluation, where the forward direction is considered to be the direction of movement between the current cell under evaluation, i.e. pixel cell 'X', and the next cell under evaluation. Finally, 1/16 of the quantization residual is transferred to the neighboring cell diagonally located in a backward direction from pixel cell X.

The kernels shown in FIGS. 8A, 8B, merely serve to explain embodiments of the invention and are not intended to have limiting effect. A skilled person will understand that it is equally well possible to use different kernels, e.g. a 3×5 kernel as proposed in "A survey of techniques for the display of continuous tone pictures on bi-level displays" by J. F. Jarvis et al. in Computer Graphics and Image Processing, 5(1) p13-14 (1976).

In embodiments of the invention, application of error diffusion is further restricted by a no-shift condition. For example, diffusion towards one or more pixel cells may be disallowed if a multi-level value in the one or more pixel cells equals to or lies below a threshold value, hereafter referred to as multi-level threshold value. Such multi-level threshold value may be equal to zero. Alternatively, diffusion towards one or more pixel cells may be disallowed if the one or more pixel cells relate to pixel cells known to be located outside a feature to be patterned. The no-shift condition warrants that a quantization residual will not be spread to pixel cells where it has a very limited chance to be effective. The no-shift condition thus effectively enhances the impact of the error diffusion, in particular in the vicinity of feature edges in a pattern.

Hereafter, the prohibition of error diffusion towards one or more neighboring pixel cells as a result of a no-shift condition will be explained with reference to FIGS. 9A, 9B. In the embodiment explained with reference to FIGS. 9A, 9B, the no-shift condition relates to a condition that uses a multi-level threshold value of zero. The no-shift condition is therefore labeled as "no-shift-to-zero" rule.

Figures 9A, 9B, 10:
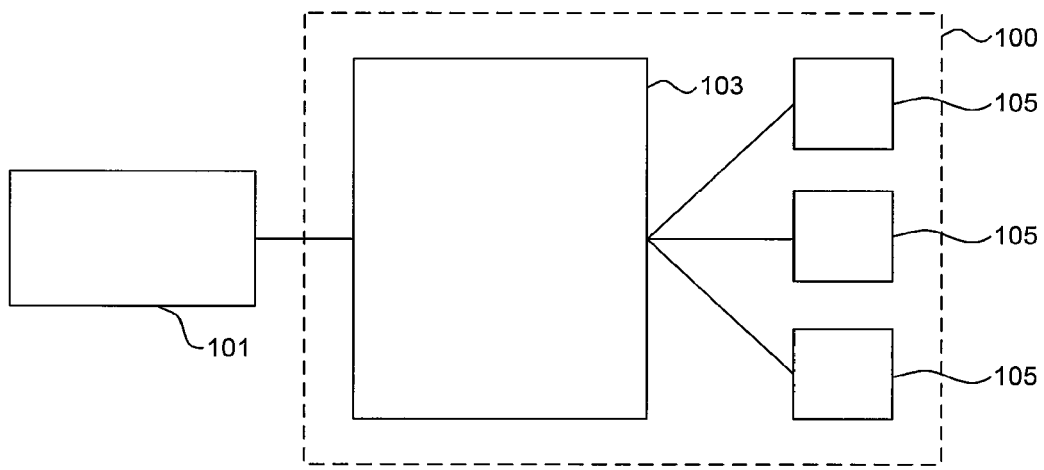
FIGS. 9A, 9B schematically illustrate the concept of a no-shift condition.
FIG. 10 schematically illustrates a data path of a multi-beamlet lithographic apparatus.

In FIG. 9A, a small portion of a grid is shown. The shown portion covers an edge of a line structure. The edge of the feature corresponds to the grid line separating the center column of pixel cells from the right column of pixel cells.

FIG. 9B schematically illustrates the application of 2D-error diffusion using the Floyd-Steinberg kernel on the center pixel cell of the grid shown in FIG. 9A including the use of the no-shift-to-zero rule. In this example, the multi-level threshold value indeed equals zero.

Generally, as schematically shown in FIG. 8B, 7/16 of the quantization residual of cell 'X' would be transferred to the next cell under evaluation. However, because the right pixel cell in the center row has a value of zero, transfer of a portion of the quantization residual towards this cell is disallowed. Therefore, no value is shifted towards this cell. The same holds for the lower right pixel cell. Instead of 1/16 of the quantization residual, no value is transferred.

Thus, half (7/16+1/16=1/2) of the residual is prohibited to move if the Floyd-Steinberg kernel is applied. In the embodiment schematically illustrated in FIG. 9B, the quantization residual is proportionally spread over the other two portions. That is, instead of 3/16, ⅜ of the quantization residual is forwarded to the left lower pixel cell. Similarly, instead of 5/16, ⅝ of the quantization residual is transferred to the center lower pixel cell.

It must be understood that different spreading algorithms may be used. For example, it may also be possible that no further spread of rejected portions of quantization residual are appended to the residuals to be transferred to "allowable" pixel cells.

FIG. 10 schematically illustrates a data path of a multi-beamlet lithographic apparatus 100, for example the apparatus discussed with reference to FIG. 1 or FIG. 3. The data path transforms pattern data, in lithographic applications generally provided in the form of a vector format like GDSII, into on/off signals for individual beamlets. The data path shown in FIG. 10 comprises an offline processing unit 101, a central processing unit 102 and a plurality of further processing units 105. The choice for a location of performing embodiments of the method depends on several factors, e.g. desired flexibility and costs.

Embodiments of the method of generating a rasterized two-level pattern for lithographic processing as described above can be performed at different locations. It may be possible to perform the method offline, i.e. as a form of pre-processing in offline processing unit 101. Such pre-processing does not have to be performed within or in close proximity of the lithographic apparatus 100.

It is also possible to perform a method inline, i.e. within the lithographic apparatus 100. Performing the method in the central processing unit 102 enables the use of different grid cell sizes. Performing the method "real time" in the further processing units 105 enables relatively quick adaptation of the pattern in view of beamlet-to-beamlet variations.

The invention has been described by reference to certain embodiments discussed above. It will be recognized that these embodiments are susceptible to various modifications and alternative forms well known to those of skill in the art without departing from the spirit and scope of the invention. Accordingly, although specific embodiments have been described, these are examples only and are not limiting upon the scope of the invention, which is defined in the accompanying claims.

What is claimed is:

1. A method of generating a two-level pattern for lithographic processing by multiple beamlets, the method comprising:
   providing a pattern in vector format;
   converting the vector format pattern into a pattern in pixmap format; and
   forming a two-level pattern by application of error diffusion on the pixmap format pattern.

2. The method of claim 1, wherein the pixmap comprises an array of pixel cells, and wherein a multi-level value is assigned to each pixel cell.

3. The method of claim 2, wherein providing multi-level values to pixel cells is based on relative coverage of the vector-format pattern by the respective pixel cell.

4. The method of claim 2, wherein providing multi-level values to pixel cells is based on dose level values of the vector format pattern.

5. The method of claim 1, wherein the vector-format pattern is formed by two-level values.

6. The method of claim 1, wherein application of error diffusion includes:
   dividing the array of pixels in portions, each portion being assigned to be patterned by a different beamlet;
   determining an error diffusion parameter value for each portion;
   assigning a two-level value to the pixel cells within each portion using said error diffusion parameter value as determined.

7. The method of claim 6, wherein determining the error diffusion parameter value is based on beamlet current measurements.

8. The method of claim 6, wherein said error diffusion parameter value is a threshold value, and wherein said assigning a two-level value to the pixel cells within a portion is based on comparison with the threshold value determined for said portion.

9. The method of claim 6, wherein said error diffusion parameter is a value representing the higher level of the two-level value.

10. The method of claim 1, wherein said error diffusion is a type of one-dimensional, 1D, error diffusion.

11. The method of claim 1, wherein said error diffusion is a type of two-dimensional, 2D, error diffusion.

12. The method of claim 11, wherein the 2D-error diffusion uses a Floyd-Steinberg kernel.

13. The method of claim 2, wherein the application of error diffusion is further restricted by disallowing diffusion towards one or more pixel cells that fulfill a no-shift condition.

14. The method of claim 13, wherein the no-shift condition is that a multi-level value assigned to said one or more pixels is equal to or below a further threshold value.

15. The method of claim 14, wherein said further threshold value equals zero.

16. The method of claim 13, wherein the no-shift condition is that said one or more pixels are located outside a feature.

17. A computer readable medium for performing, when executed by a processor, the method of generating a rasterized two-level pattern as defined by claim 1.

18. A pattern generator comprising:
   an input for receiving a pattern in vector format;
   a processing unit for performing the method of generating a two-level pattern for lithographic processing according to claim 1; and
   an output for supplying the two-level pattern.

19. The pattern generator of claim 18, further comprising a memory for storing a pattern in pixmap format, the memory being communicatively coupled to the processing unit.

20. A charged particle multi-beamlet system for exposing a target using a plurality of beamlets, the system comprising:
   a beamlet modulation system for modulating the plurality of beamlets so as to form an exposure pattern;
   a projection system for projecting the modulated beamlets on to the surface of the target;
   a deflector array for deflecting the plurality of beamlets in a first direction;
   a substrate support member for supporting the target to be exposed;
   a control unit arranged to coordinate relative movement between the substrate support member and the plurality of beamlets in a second direction and movement of the group of beamlets in the first direction such that the target can be exposed in accordance with an array of pixel cells;
wherein the charged-particle multi-beamlet system further comprises a beamlet pattern generator of claim 18.

21. The system of claim 20, wherein the projection system comprises an array of projection lens systems.

22. The system of claim 21, wherein the plurality of beamlets is arranged in groups of beamlets, and each projection lens system corresponds with a group of beamlets.

23. The system of claim 21, wherein the deflector array comprises a plurality of deflectors, each deflector being arranged to deflect a corresponding group of beamlets.

24. Lithographic system comprising:
   a preprocessing unit;
   a charged particle multi-beamlet system for exposing a target using a plurality of beamlets in accordance with a two-level pattern;
wherein the preprocessing unit comprises a beamlet pattern generator of claim 18.

25. The lithographic system of claim 24, wherein the charged particle multi-beamlet system comprises:
   a beamlet modulation system for modulating the plurality of beamlets so as to form an exposure pattern;
   a projection system for projecting the modulated beamlets on to the surface of the target;

a deflector array for deflecting the plurality of beamlets in a first direction;

a substrate support member for supporting the target to be exposed;

a control unit arranged to coordinate relative movement between the substrate support member and the plurality of beamlets in a second direction and movement of the group of beamlets in the first direction such that the target can be exposed in accordance with an array of pixel cells.

26. The system of claim 25, wherein the projection system comprises an array of projection lens systems.

27. The system of claim 26, wherein the plurality of beamlets is arranged in groups of beamlets, and each projection lens system corresponds with a group of beamlets.

28. The system of claim 26, wherein the deflector array comprises a plurality of deflectors, each deflector being arranged to deflect a corresponding group of beamlets.

* * * * *